US011280856B2

(12) United States Patent
Li et al.

(10) Patent No.: US 11,280,856 B2
(45) Date of Patent: Mar. 22, 2022

(54) DIRECT ELECTRICAL DETECTION OF CURRENT-INDUCED SPIN POLARIZATION DUE TO SPIN-MOMENTUM LOCKING IN TOPOLOGICAL INSULATORS

(71) Applicant: The Government of the United States of America, as represented by the Secretary of the Navy, Arlington, VA (US)

(72) Inventors: Connie H. Li, Alexandria, VA (US); Olaf M. J. van 't Erve, Falls Church, VA (US); Jeremy T. Robinson, Washington, DC (US); Ying Liu, Waterloo (CA); Lian Li, Milwaukee, WI (US); Berend T. Jonker, Waldorf, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/081,575

(22) Filed: Oct. 27, 2020

(65) Prior Publication Data
US 2021/0109171 A1 Apr. 15, 2021

Related U.S. Application Data

(60) Continuation of application No. 16/168,583, filed on Oct. 23, 2018, now Pat. No. 10,852,370, which is a
(Continued)

(51) Int. Cl.
*G01R 33/09* (2006.01)
*H01L 43/10* (2006.01)
(Continued)

(52) U.S. Cl.
CPC ............ *G01R 33/096* (2013.01); *H01L 43/08* (2013.01); *H01L 43/10* (2013.01); *H01L 43/12* (2013.01)

(58) Field of Classification Search
CPC ....... G01R 33/096; H01L 43/10; H01L 43/12; H01L 43/08
See application file for complete search history.

(56) References Cited

U.S. PATENT DOCUMENTS

2015/0001601 A1\* 1/2015 Koike ............... H01L 29/66984
257/295

OTHER PUBLICATIONS

Hong et al. "Modeling potentiometric measurements in topological insulators including parallel channels," Physical Review B 86, 085131 (Year: 2012).\*

(Continued)

*Primary Examiner* — Lee E Rodak
(74) *Attorney, Agent, or Firm* — US Naval Research Laboratory; Stephen T. Hunnius (57) ABSTRACT

A device for directly electrically generating and detecting the current-generated spin polarization in topological insulators, comprising a first and fourth contact on a layer of $Bi_2Se_3$ and a second contact comprising a ferromagnet/oxide tunnel barrier contact as a detector, and a third contact comprising nonmagnetic metal as a reference contact, a current to the first and fourth contact to produce a net spin polarization, and the spin polarization manifesting as a voltage between the second (magnetic) and third (reference) contacts.

8 Claims, 6 Drawing Sheets

Related U.S. Application Data division of application No. 14/934,240, filed on Nov. 6, 2015, now Pat. No. 10,132,880.

(60) Provisional application No. 62/089,950, filed on Dec. 10, 2014.

(51) Int. Cl.
*H01L 43/12* (2006.01)
*H01L 43/08* (2006.01)

(56) References Cited

OTHER PUBLICATIONS

Hammar et al. "Observation of spin polarized transportacross a ferromagnet-two dimensional electron gas interface," Journal of Applied Physics 87, 4665, (Year: 2000).*

* cited by examiner

DIRECT ELECTRICAL DETECTION OF CURRENT-INDUCED SPIN POLARIZATION DUE TO SPIN-MOMENTUM LOCKING IN TOPOLOGICAL INSULATORS

This application claims priority to and the benefits of U.S. patent application Ser. No. 16/168,583 filed on Oct. 23, 2018 and U.S. patent application Ser. No. 14/934,240 filed on Nov. 6, 2015 and U.S. Patent Application No. 62/089,950 filed on Dec. 10, 2014, the entirety of each is herein incorporated by reference.

BACKGROUND

Topological insulators (TI) form a new quantum phase of solid state matter distinct from the classic dichotomy of metals and insulators. Although the bulk is nominally insulating (forms a band gap), the two dimensional surface bands form a Dirac cone populated by massless fermions. These surface states are topologically protected against disorder scattering and are spin-polarized. Hence TIs are expected to produce new functionalities for a wide range of applications such as low power electronics (owing to dissipationless transport), spintronics (utilizing spin-polarized current), and quantum information technology.

One of the unique and most striking properties is that of spin-momentum locking—the spin of the surface state is locked at right angle to the carrier momentum. This characteristic has been probed by photoemission measurements on cleaved samples in ultra high vacuum.

In principal, inducing a net carrier momentum (by applying a bias current, for example) spontaneously generates a net spin polarization.

However, attempts at accessing the spin-momentum locking of the surface states by electrical means, i.e., generating such spin polarization and directly sampling the current-induced spin polarization, have not been successful, and these effects have not been demonstrated outside of our work reported here.

This in large part is due to the fact that the bulk is typically heavily doped, and therefore provides a parallel conduction path, which short circuits transport in the surface states and overwhelms any signal originating from the surface states.

Here, by utilizing a ferromagnet/tunnel barrier contact that is intrinsically sensitive to surface/interface spins, demonstrated for the first time is that one can directly generate a net spin accumulation with a simple bias current, and directly detect the current-induced spin polarization of the surface spin due to spin-momentum locking, where its projection onto the detector contact magnetization manifest as a voltage.

SUMMARY OF THE INVENTION

This invention demonstrates a method to directly electrically generate spin polarization due to spin-momentum locking of the topologically protected surface states in topological insulators (TI), and directly electrically detect this spin accumulation, thereby enabling utilization of the spin polarized surface states for spintronic/electronic applications.

Here we create a net spin polarization by applying an unpolarized bias current, and utilize a ferromagnetic thin film surface contact to detect this spin polarization. The magnetization of the contact determines the spin detection axis, and the projection of the TI spin polarization onto this axis is detected electrically as a voltage. The invention has applications in low power electronics, spintronics that utilize spin-polarized currents, as well as quantum information technology. We use thin films of the topological insulator $Bi_2Se_3$ to demonstrate the efficacy of the approach.

DETAILED DESCRIPTION

This invention demonstrates a method to directly electrically generate spin polarization due to spin-momentum locking of the topologically protected surface states in topological insulators (TI), and directly electrically detect this spin accumulation, thereby enabling utilization of the spin polarized surface states for spintronic/electronic applications.

Here a net spin polarization is created by applying an unpolarized bias current, and a ferromagnetic thin film surface contact is utilized to detect this spin polarization.

The magnetization of the contact determines the spin detection axis, and the projection of the TI spin polarization onto this axis is detected electrically as a voltage.

The invention has applications in low power electronics, spintronics that utilize spin-polarized currents, as well as quantum information technology.

Thin films of the topological insulator $Bi_2Se_3$ are used to demonstrate the efficacy of the approach.

Here, by utilizing a ferromagnet/tunnel barrier contact that is intrinsically sensitive to surface/interface spins, demonstrated for the first time is that one can directly generate a net spin accumulation with a simple bias current, and directly detect the current-induced spin polarization of the surface spin due to spin-momentum locking, where its projection onto the detector contact magnetization manifest as a voltage.

Examples of TI materials include $Bi_{1-x}Sb_x$, $Bi_2Se_3$, $Bi_2Te_3$ and $Sb_2Te_3$. $Bi_2Se_3$ is regarded as a model TI—it exhibits a single Dirac cone and the largest band gap (~0.3 eV) of known TIs, and its topological surface states have been shown to persist to at least room temperature, insensitive to magnetic and nonmagnetic surface adsorbates, and stable even in air exposed samples. Such robustness is essential for the realization of future device structures based on the interplay of spin transport, ferromagnetism and spin-momentum locking.

This invention demonstrates a method to directly electrically generate spin polarization, due to a novel effect of spin-momentum locking of the topologically protected surface states, in topological insulators (TI), and to directly electrically detect this spin accumulation. Here we create a net spin polarization by applying a current, and utilize a ferromagnetic/tunnel barrier thin film surface contact to detect this spin polarization.

Example 1

Briefly, single-crystalline $Bi_2Se_3$ thin films are grown by molecular beam epitaxy (MBE). The ferromagnet/oxide tunnel barrier contacts are then grown on top of the $Bi_2Se_3$ in separate deposition systems. The samples are then patterned into electrically addressable test structures.

Figure 1A:
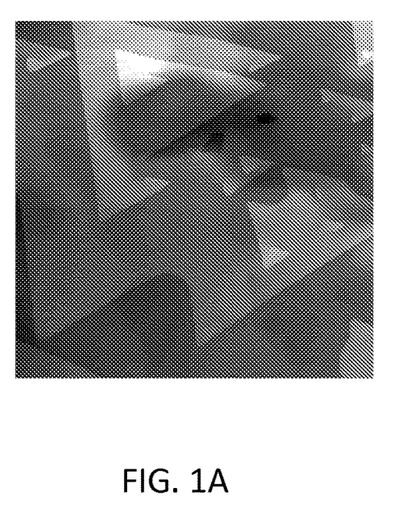
FIG. 1A is an STM image of $Bi_2Se_3$ surface morphology.
Figure 1B:
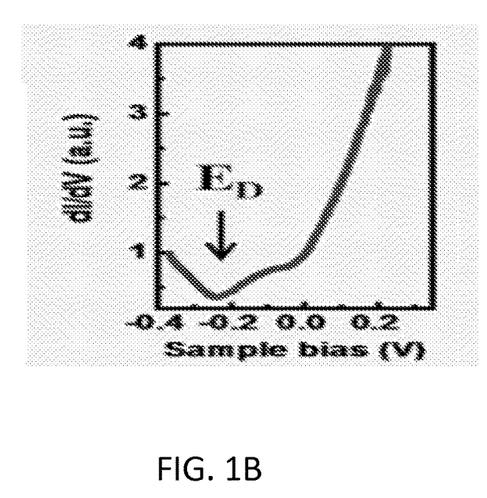
FIG. 1B is a tunneling spectroscopy image showing the position of the Dirac point.
Figure 1C:
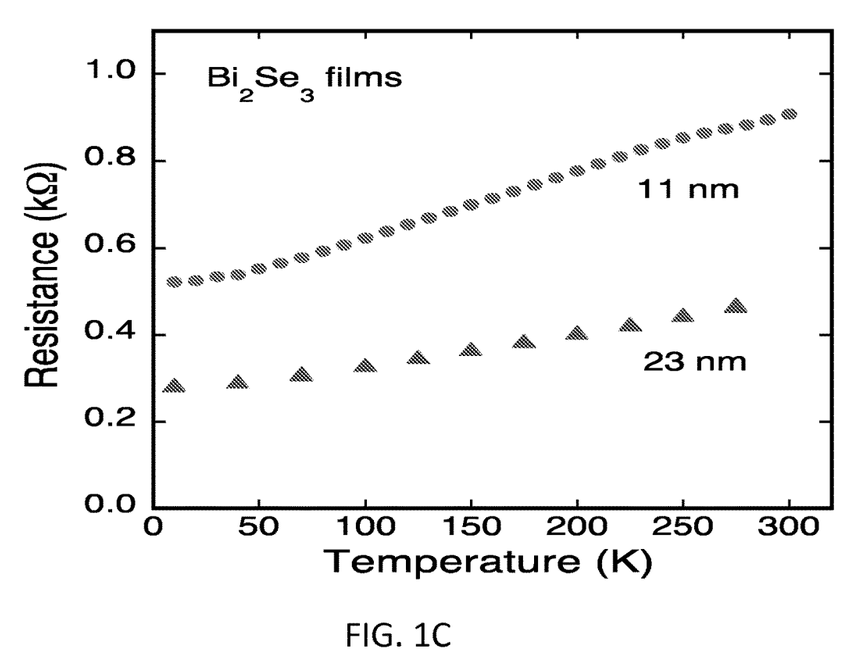
FIG. 1C illustrates the temperature dependent resistance of 11 and 23 nm films.

In situ scanning tunneling microscopy (STM) imaging and tunneling microscopy is used to monitor surface morphology and electronic structure and ensure optimal layer-by-layer spiral growth (FIG. 1) during MBE and film quality (before ferromagnetic/oxide tunnel barrier growth). The as-grown $Bi_2Se_3$ film exhibits a Dirac point (ED) 250 meV below the Fermi level in tunneling spectra, indicating n-type doping typically seen in MBE grown materials due to Se vacancies. The as-grown films exhibit n~$10^{19}$/cm$^3$ electron doping, with the Fermi level well within the bulk conduction band, as evident from the metal-like temperature dependent resistance (FIG. 1).

Example 2

Deposition of Ferromagnet (FM)/Tunnel Barrier Contact

Two types of FM/tunnel barrier detector contacts are demonstrated as spin sensitive probes. Such contacts have successfully enabled electrical detection of spin current and accumulation in both semiconductors and metals.

$Fe/Al_2O_3$ contacts are deposited on air-exposed $Bi_2Se_3$ surface in a separate MBE system as follows. A 0.7 nm layer of polycrystalline Al was first deposited by MBE, and then oxidized in 200 Torr $O_2$ for 20 min in the presence of UV light in the load-lock chamber. This step was then repeated for a total $Al_2O_3$ thickness of 2 nm. The sample was then transferred under ultra high vacuum to an interconnected metals MBE chamber, where 20 nm of polycrystalline Fe was deposited at room temperature from a Knudsen cell.

The oxide tunnel barrier is essential to prevent potential direct magnetic exchange with the TI surface states, interdiffusion between TI and FM which may result in undesirable alloy formation and spin scattering, and to enable preferential sampling of the TI surface state at the oxide/TI interface rather than the bulk.

Co/MgO/graphene contacts are fabricated by first transferring a single graphene layer grown by chemical vapor deposition onto an air-exposed $Bi_2Se_3$ surface, and then patterned so that it was only underneath the detector contacts. We have previously shown that single layer graphene forms an effective tunnel barrier on both metal and semiconductor surfaces which prevents oxidation and interdiffusion.

A 2 nm MgO film was then deposited by electron beam evaporation following the deposition of 0.1 nm Ti seed layer. A 15 nm Co layer is immediately deposited in the same evaporation system without breaking vacuum.

Figure 2:
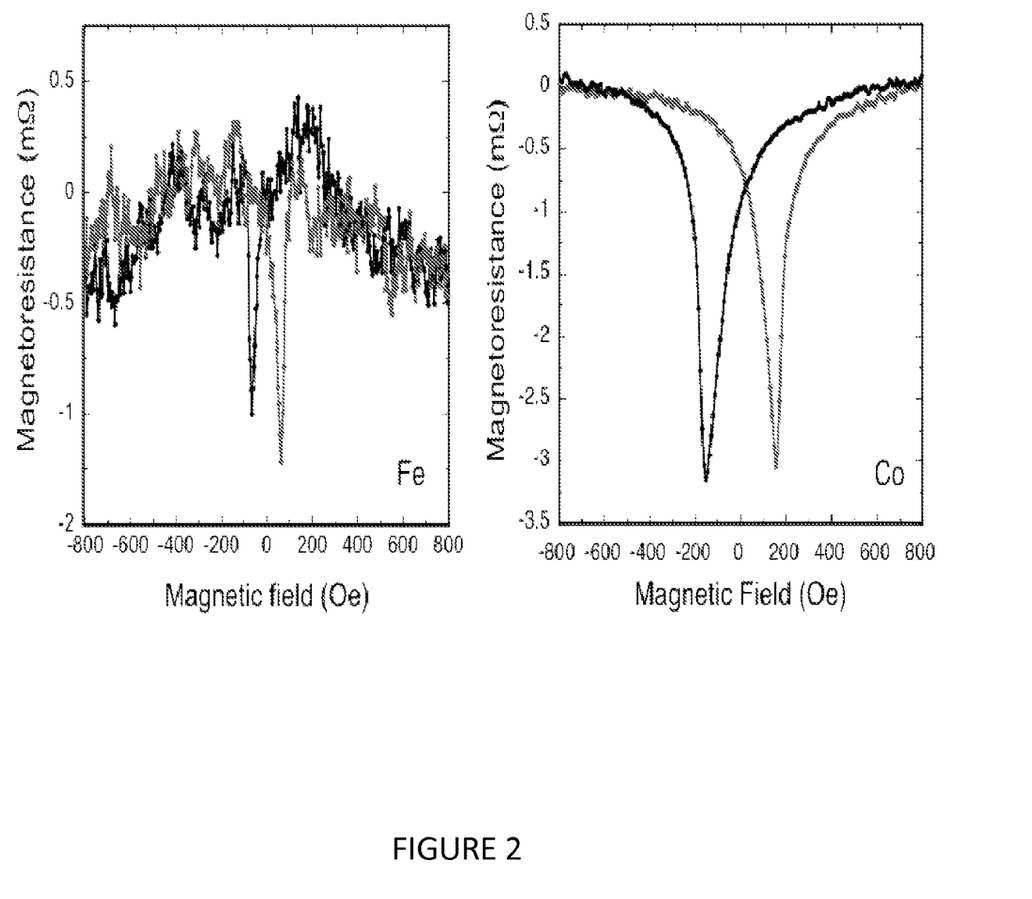
FIG. 2 illustrates anisotropic magnetoresistance measurements of the Fe and Co contacts showing their switching behavior.

The magnetic characteristics of the FM contacts are determined from anisotropic magnetoresistance (AMR) measurements (FIG. 2) in a two terminal geometry where current flows through the FM material. The characteristic AMR signal indicates a switching field of 62±5 and 150±5 Oe for the Fe and Co contacts at 10 K, respectively, with a broader peak for the Co indicating a broader field range for the contact magnetization reversal.

Example 3

Sample Fabrication

Figure 3:
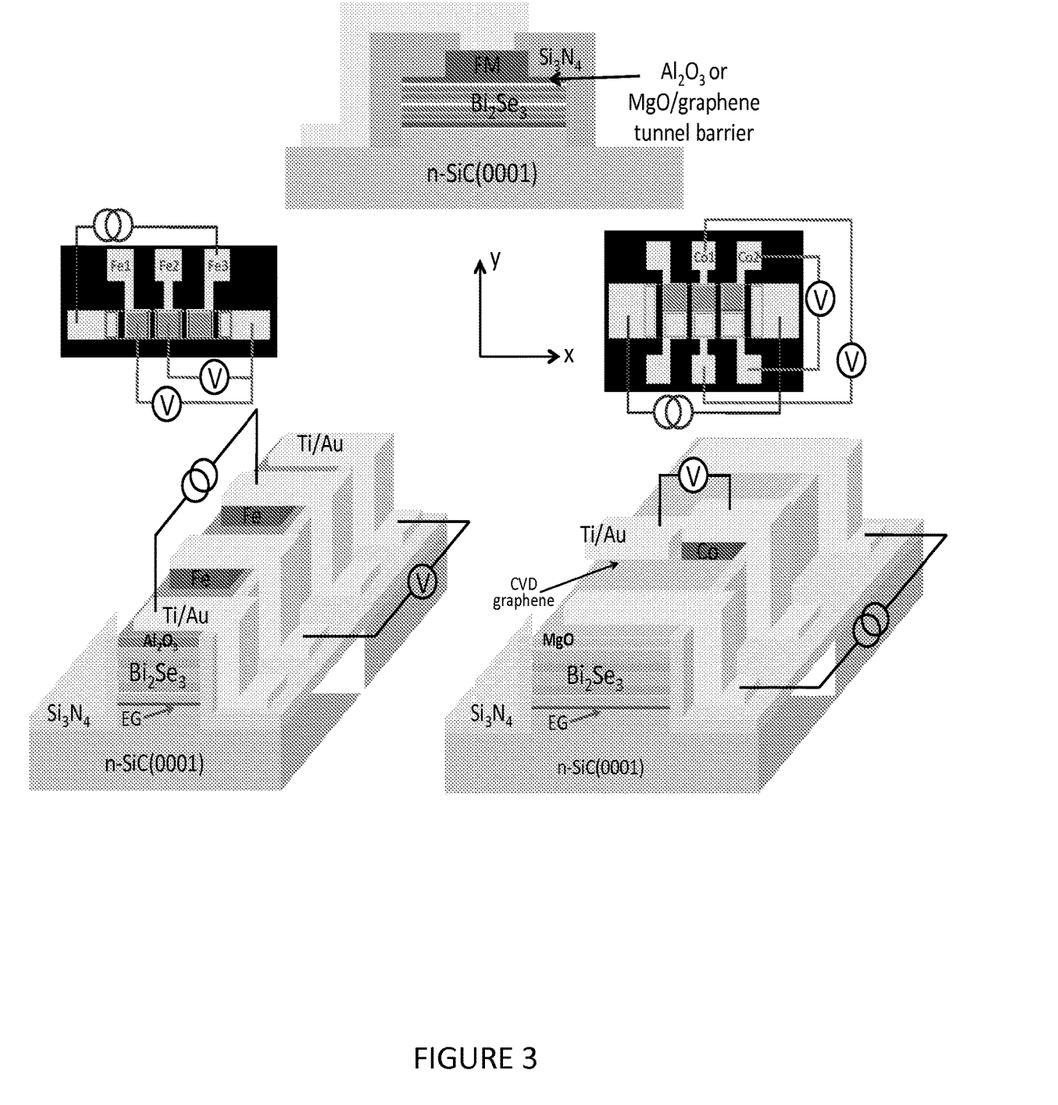
FIG. 3 illustrates sample structure and measurement geometry.

The samples were processed into the device structures illustrated in FIG. 3 to enable transport measurements. Standard photolithography and chemical etching methods were used to define the Fe contacts, which ranged in size from 10×10 μm$^2$ to 80×80 μm$^2$, with adjacent contact separation ranging from 45 to 200 μm. Ion milling was used to pattern the $Bi_2Se_3$ mesa.

Large Ti/Au contacts were deposited by lift-off in an electron beam evaporator as non-magnetic reference contacts and bias current leads. The Fe contacts were capped with 10 nm Ti/100 nm Au, and bond pads for wire bonded electrical connections are electrically isolated from the Si using 100 nm of $Si_3N_4$.

Example 4

Measurement Geometry.

The device structures are shown in FIG. 3, where two different types of measurement geometries are employed. The first (left panel) consist of a co-linear series of ferromagnetic detector and non-magnetic Au/Ti reference contacts. The second type (right panel) features adjacent rows of magnetic and non-magnetic (reference) detector contacts, where the placement of the non-magnetic contact immediately adjacent to the FM detector as the voltage reference to directly subtract non-magnetization-dependent background contributions results in a substantial improvement to signal quality and reduction in the background voltage.

Example 5

Confirmation of Electrical Detection of Spin-Momentum Locking.

As shown in the contact layout in FIG. 3 (left panel), a fixed current is applied between two contacts on either side of and co-linear with the detector, and the voltage at the detector is recorded as a function of an in-plane magnetic field applied orthogonal to the current direction in the TI. No current flows through the detector contact. Electrons flow from left to right along the +x axis for a negative current, and a positive magnetic field points in either +x or +y direction.

Figure 4:
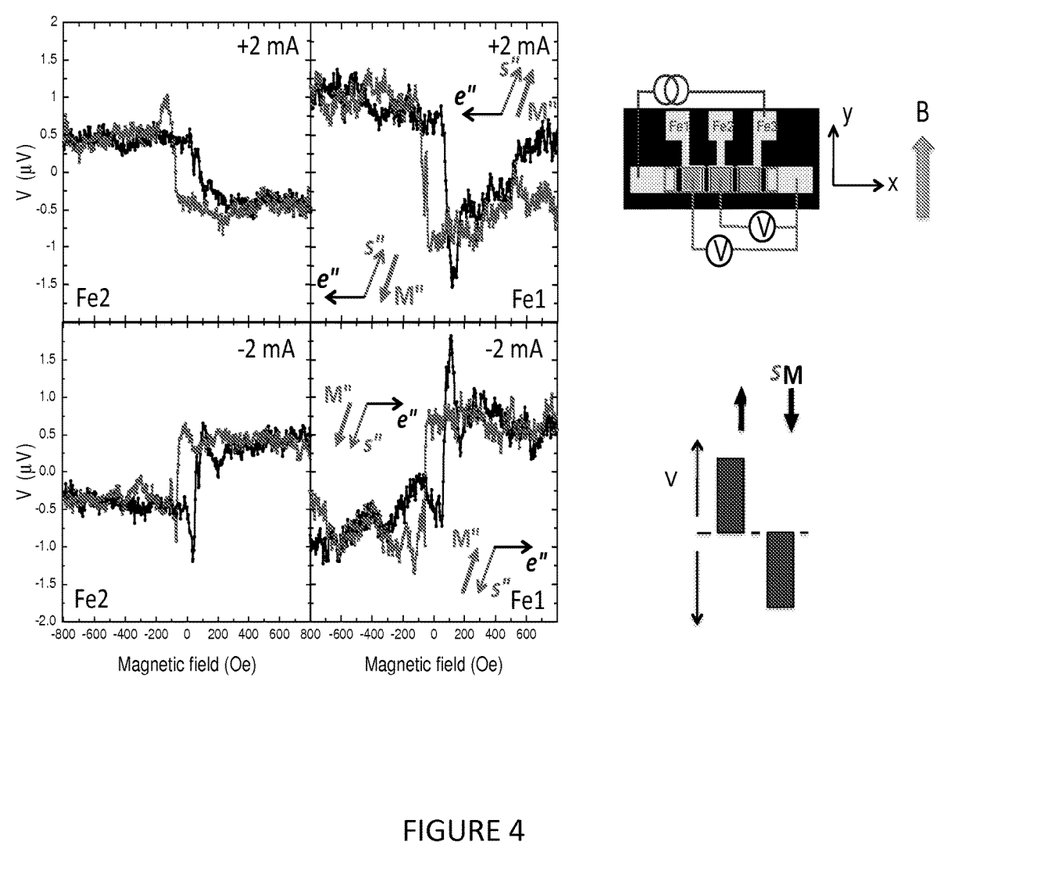
FIG. 4 illustrates TI spin polarization detected as a voltage with $Fe/Al_2O_3$ collinear contacts.

When the field is orthogonal to the current direction, the detector contact magnetization is switched to be either parallel or anti-parallel to the current-induced spin in the TI surface, and the detector voltage exhibits clear hysteretic behavior (FIG. 4). The relative orientation of electron current (e), induced TI spin polarization (s), and contact magnetization (M) are shown by the insets. At large positive fields, the magnetization is parallel to the TI surface state spin polarization, and a constant negative voltage is measured as the field decreases to zero. As the field changes to small negative values, an abrupt increase in the detector voltage is observed at the coercive field (−65 Oe) of the detector, i.e. when the detector magnetization reverses to be anti-parallel with the TI surface state spin. When the field sweep direction is reversed, the behavior reverses where distinct voltages are measured when the detector magnetization is parallel or anti-parallel to the current-induced spin orientation.

When the direction of the bias current is reversed, the orientation of the TI spin is also reversed, and the field dependence of the FM detector voltage flips about the zero voltage axis (FIG. 4). The voltage on a non-magnetic detector exhibits no such step-like behavior.

Example 6

Improved Signal Quality with Adjacent Reference Contact Placement.

Figure 5:
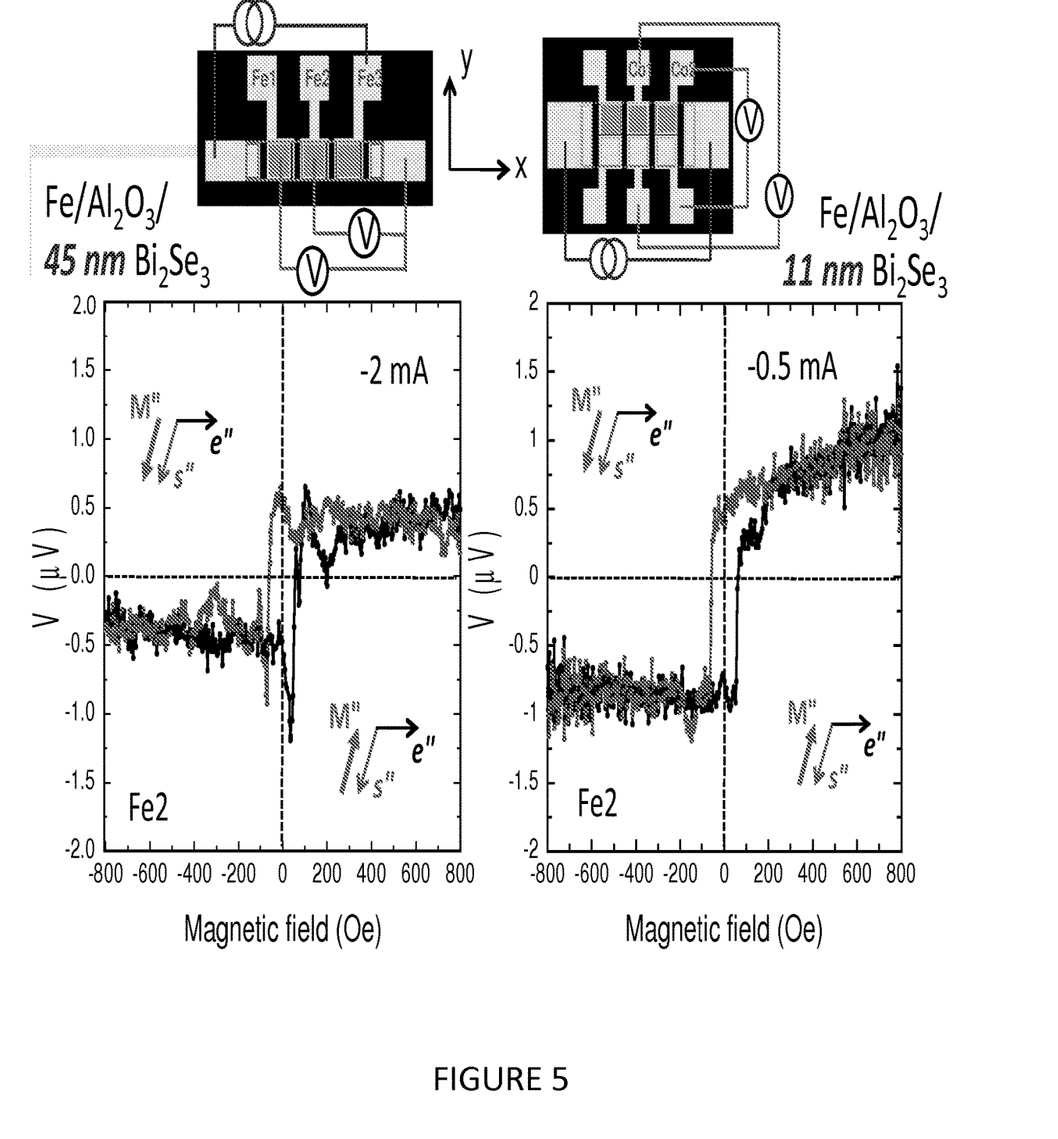
FIG. 5 illustrates improvement of signal quality with measurement geometry with adjacent nonmagnetic reference contact.
Figure 6:
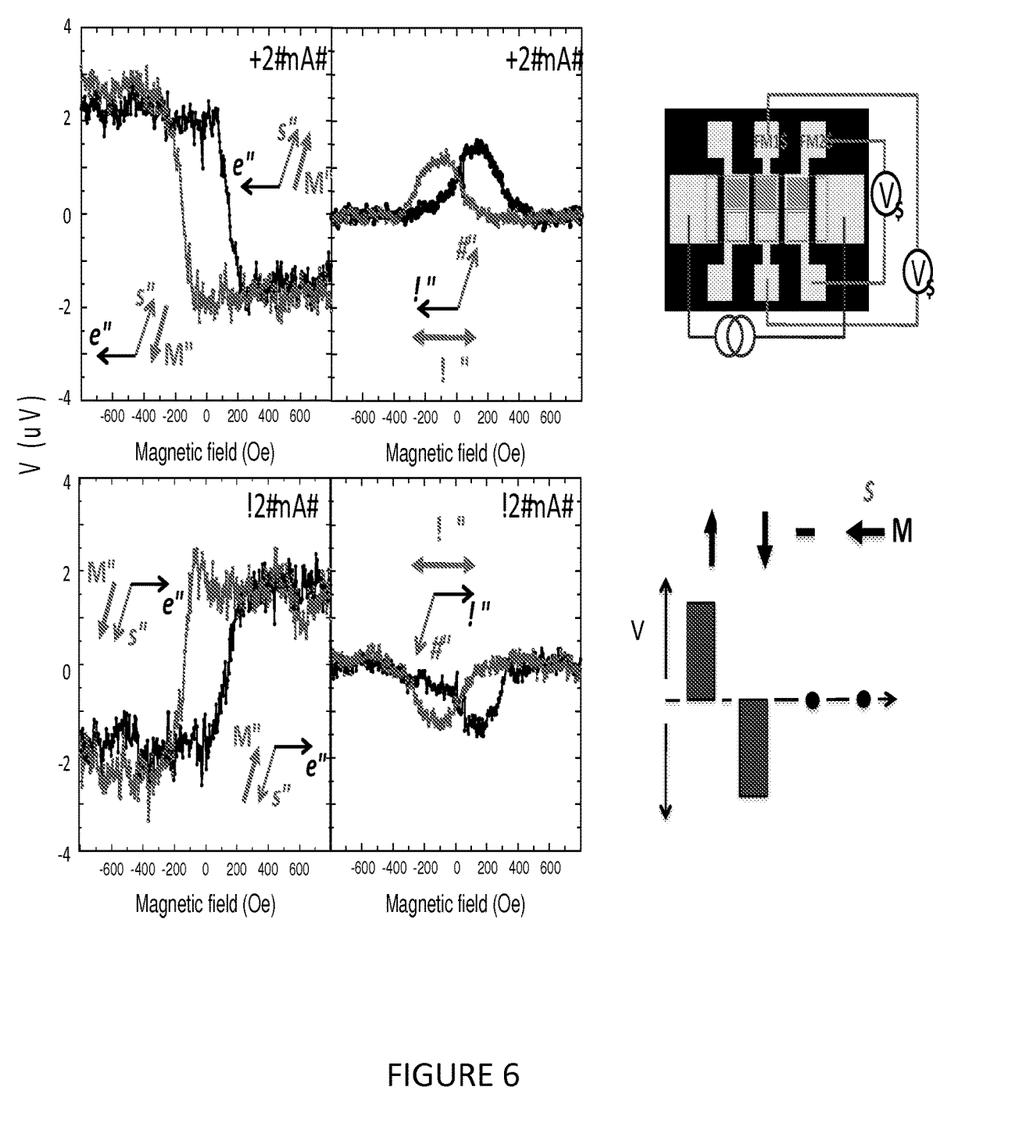
FIG. 6 illustrates TI spin polarization detected as a voltage with Co/MgO/graphene contacts.

FIG. 5 shows a second set of devices with Fe/Al$_2$O$_3$ tunnel barrier contacts on an 11 nm Bi$_2$Se$_3$ epilayer on a sapphire substrate using an adjacent nonmagnetic reference contact (FIG. 3 right panel). A substantial improvement to the signal quality is seen with reduction in the background voltage.

Example 7

Further Confirmation with Different FM/Tunnel Barrier Contact.

A third set of devices were fabricated with Co/MgO/graphene tunnel contacts on 25 nm Bi$_2$Se$_3$ using the geometry utilizing adjacent reference contacts (FIG. 3 right panel). A similar behavior is observed in the magnetic field dependence of the Co detector voltage (FIG. 5), demonstrating that the spin-voltage behaviors measured are reproduced with a completely different detector. The larger coercive field of the Co and the slower reversal and saturation of the magnetization is reflected in the width of the hysteretic loop observed in the detector voltage.

Also evident is when the magnetic field is applied along the bias current direction, where the contact magnetization is orthogonal to the current-induced spin orientation. A zero signal is expected, as observed at large (positive and negative) magnetic fields. However at smaller field as the contact magnetization is switched, a small peak in the detector voltage is observed.

The sign of voltage signal [V(M)−V(−M)] was further verified to be consistent with that of spin-momentum locking and not of other origins such as that from Rashba spin-split states, bases on qualitative analysis of the data using a theoretical model.

The surface states of topological insulators exhibit exotic properties such as dissipationless transport and spin-momentum locking that do not exist in any other materials, and are expected to provide new functionalities for applications such as low power electronics, spintronics, and quantum information processing.

Direct electrical access to these surface states spin system is essential to the realization of these potential applications. However, parallel conduction through the bulk often overwhelms the signatures of transport through the surface states.

Here, using a ferromagnet/tunnel barrier contact we preferentially probe the surface spins and circumvent the issue of parallel bulk conduction plagued by other transport approaches.

This route demonstrates the first direct electrical generation of spin polarization due to spin-momentum locking in these topologically protected TI surface states, and direct electrical detection of this spin accumulation, thereby enabling utilization of the spin polarized surface states for spintronic/electronic applications.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A device for directly electrically generating and detecting the current-generated spin polarization in topological insulators, comprising:
   a first contact and fourth contact on a layer of Bi$_2$Se$_3$;
   a second contact comprising a ferromagnet/oxide tunnel barrier contact on a layer of Bi$_2$Se$_3$;
   wherein the ferromagnet/oxide tunnel barrier comprises a layer of Fe and a layer of Al$_2$O$_3$;
   wherein the second contact is a detector;
   a third contact on the layer of Bi$_2$Se$_3$;
   wherein the third contact is a reference;
   wherein the device is configured to have current flow from the first to the fourth contact resulting in a net spin polarization wherein the spin polarization manifests as a voltage between the second and the third contact.

2. The device for directly electrically generating and detecting the current-generated spin polarization in topological insulators of claim 1 wherein the current is an unpolarized bias current.

3. A method of making a device for directly electrically generating and detecting spin polarization in topological insulators, comprising the steps of:
   depositing a first contact and fourth contact on a layer of Bi$_2$Se$_3$;
   depositing a second contact and third contact wherein the second contact comprises a ferromagnet/oxide tunnel barrier contact and wherein the third contact comprises a nonmagnetic metal contact;
   wherein the ferromagnet/oxide tunnel barrier comprises a layer of Fe and a layer of Al$_2$O$_3$;
   applying a current between the first contact and fourth contact;
   creating a net spin polarization due to spin-momentum locking; and
   detecting the spin polarization between the second contact and the third contact.

4. The method for directly electrically generating and detecting spin polarization in topological insulators of claim 3 wherein the current is an unpolarized bias current.

5. The method for directly electrically generating and detecting spin polarization in topological insulators of claim 3 wherein the step of detecting the spin polarization due to spin-momentum locking is based on a projection of the spin polarization onto the magnetization axis of the second contact manifested as a voltage.

6. The method for directly electrically generating spin polarization in topological insulators of claim 3 wherein the step of detecting the spin polarization comprises detecting a voltage between the second ferromagnet/oxide tunnel barrier contact and the third contact.

7. The method for directly electrically generating spin polarization in topological insulators of claim 6 wherein a magnetization of the second contact determines a spin detection axis and a projection of the spin polarization onto the spin detection axis is detected electrically as a voltage.

8. A product of a process of making a device for directly electrically generating and detecting spin polarization in topological insulators, comprising:

depositing a first contact and fourth contact on a layer of $Bi_2Se_3$;

depositing a second contact and third contact wherein the second contact comprises a ferromagnet/oxide tunnel barrier contact and wherein the third contact comprises a nonmagnetic metal contact;

wherein the ferromagnet/oxide tunnel barrier comprises a layer of Fe and a layer of $Al_2O_3$;

applying a current between the first contact and fourth contact;

creating a net spin polarization due to spin-momentum locking; and detecting the spin polarization between the second contact and the third contact.

* * * * *